(12) United States Patent
Jeon et al.

(10) Patent No.: US 8,269,414 B2
(45) Date of Patent: Sep. 18, 2012

(54) ORGANIC LIGHT EMITTING DISPLAY AND MANUFACTURING THEREOF

(75) Inventors: Heechul Jeon, Yongin-si (KR); Juwon Yoon, Yongin-si (KR)

(73) Assignee: Samsung Display Co., Ltd., Yongin (KR)

( * ) Notice: Subject to any disclaimer, the term of this patent is extended or adjusted under 35 U.S.C. 154(b) by 134 days.

(21) Appl. No.: 12/143,151

(22) Filed: Jun. 20, 2008

(65) Prior Publication Data

US 2008/0315756 A1 Dec. 25, 2008

(30) Foreign Application Priority Data

Jun. 20, 2007 (KR) .................. 10-2007-0060715

(51) Int. Cl.
*H01L 27/28* (2006.01)
*H01L 27/32* (2006.01)
(52) U.S. Cl. .................. 313/504; 313/498; 313/506
(58) Field of Classification Search ........... 313/498–512
See application file for complete search history.

(56) References Cited

U.S. PATENT DOCUMENTS

| | | | | |
|---|---|---|---|---|
| 2004/0135501 | A1* | 7/2004 | Nishikawa | 313/506 |
| 2004/0178724 | A1* | 9/2004 | Karasawa et al. | 313/506 |
| 2005/0258741 | A1* | 11/2005 | Kim et al. | 313/503 |
| 2007/0069639 | A1* | 3/2007 | Noh et al. | 313/504 |

FOREIGN PATENT DOCUMENTS

| | | |
|---|---|---|
| KR | 10-0590253 | 6/2006 |
| KR | 10-0669715 | 1/2007 |

OTHER PUBLICATIONS

English-language abstract of KR 10-2006-0002668.
English-language abstract of KR 10-2006-0046811.

* cited by examiner

*Primary Examiner* — Anh Mai
*Assistant Examiner* — Nathaniel Lee
(74) *Attorney, Agent, or Firm* — Christie, Parker & Hale, LLP

(57) ABSTRACT

An organic light emitting display and a manufacturing method that prevents an open edge from occurring when forming an emission layer of an organic light emitting display in order to prevent a dielectric breakdown from occurring at the edge of an anode electrode. The organic light emitting display includes: a substrate; an active layer formed on the substrate; a planarization layer formed on the active layer; an anode electrode formed on the planarization layer; a pixel definition layer formed on the upper surface of the planarization layer to cover an edge of the anode electrode; and an organic thin film formed on the pixel definition layer, wherein the pixel definition layer includes a thick film portion and a step down portion that is formed to be stepped down at both ends of the thick film portion.

16 Claims, 7 Drawing Sheets

ORGANIC LIGHT EMITTING DISPLAY AND MANUFACTURING THEREOF

CROSS-REFERENCE TO RELATED APPLICATION

This application claims the benefit of Korean Application No. 2007-60715, filed on Jun. 20, 2007, in the Korean Intellectual Property Office, the disclosure of which is incorporated herein by reference.

BACKGROUND OF THE INVENTION

1. Field of the Invention

Aspects of the present invention relate to an organic light emitting display and a method of manufacturing thereof and more particularly, to an organic light emitting display and a method of manufacturing thereof where the light emitting display includes step portions (hereinafter step portions or step down portions) formed to be stepped down at both side ends of a pixel definition layer, thereby preventing an open edge from occurring when forming a light emitting layer and preventing a dielectric breakdown from occurring at an edge of an anode electrode.

2. Description of the Related Art

In general, an organic light emitting display includes a pixel definition layer (hereinafter, referred to as PDL) to cover an edge of an anode electrode. Also, a portion of the PDL is formed with an emission layer (hereinafter, referred to as EML) as part of a group of organic thin films.

For patterning an EML, a shadow mask is used for a small molecule organic light emitting diode, and an ink-jet printing or a laser induced thermal imaging (hereinafter, referred to as LITI) is used for a polymeric organic light emitting diode.

A donor substrate formed with an organic film layer thereon is laminated first in order to form an EML by using the laser induced thermal imaging LITI method. Then, the EML patterned on the substrate can be formed by irradiating a predetermined portion of the donor substrate. That is, an irradiated portion on the organic film layer of the donor substrate is separate from a non-irradiated portion thereon so as to form an emission layer pattern.

Accordingly, there is a need to design a PDL in such a way as to prevent an open edge occurring when an edge of an anode electrode does not properly contact an EML during patterning the EML in a laser induced thermal imaging LITI method, and therefore to prevent a dielectric breakdown occurring at the edge of the anode electrode because of an electric field.

SUMMARY OF THE INVENTION

Aspects of the present invention are directed to solving the above-described drawbacks. Aspects of the present invention provide an organic light emitting display and a manufacturing method thereof in which an open edge does not occur when forming an EML.

Aspects of the invention provide an organic light emitting display and a manufacturing method thereof which can improve the light emitting display's reliability by preventing a dielectric breakdown occurring at an edge of an anode electrode.

An organic light emitting display, according to aspects of the invention, includes: a substrate; an active layer formed on the substrate; a planarization layer formed on the active layer; an anode electrode formed on the planarization layer; a PDL formed on the upper planarization layer to cover an edge of the anode electrode; and an organic thin film formed on the PDL.

The PDL may include a thick film portion and a step portion formed to be stepped at both ends of the thick film portion. In that case, the step portion may be 0.3 μm thick or less. Then, the edge of the anode electrode is positioned under the region of the thick film portion, and the thick film portion may be 1 μm thick or more.

Also, the organic thin film may include an emission layer EML, and the emission layer EML may be formed overlapping a portion of the anode electrode and the step portion (hereinafter step portion or step down portion) of the PDL. In addition, the step portion may include a first surface contacting the anode electrode, a second surface contacting the first surface and a third surface inclined to the second surface so that it contacts the second surface. The emission layer EML may cover the first surface. Then, the first surface will contact the anode electrode at an angle of 45 degrees or less.

According to aspects of the invention, a method of manufacturing an organic light emitting display includes: forming an active layer on a substrate; forming a planarization layer on the active layer; forming an anode electrode on the planarization layer; forming a PDL on the upper portion of the planarization layer to cover an edge of the anode electrode and forming an organic thin film on the PDL.

The PDL may include a thick film portion and a step portion which is formed to be stepped at both ends of the thick film portion. The step portion has a thickness of 0.3 μm or less. An edge of the anode electrode is positioned on a region thickness.

In addition, the organic thin film will include the emission layer EML. The emission layer EML may be formed on the step portion. Further, forming the organic thin film may result in a first surface contacting the anode electrode, a second surface contacting the first surface, and a third surface inclined to the second surface so that it contacts the second surface. The emission layer EML may be formed on the first surface. In this case, the organic thin film may cause the first surface to contact the anode electrode at an angle of 45 degrees or less.

The PDL may be formed by a photolithography process or through use of a mask. The mask may be a halftone mask which partially changes the phase of the radiated light.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
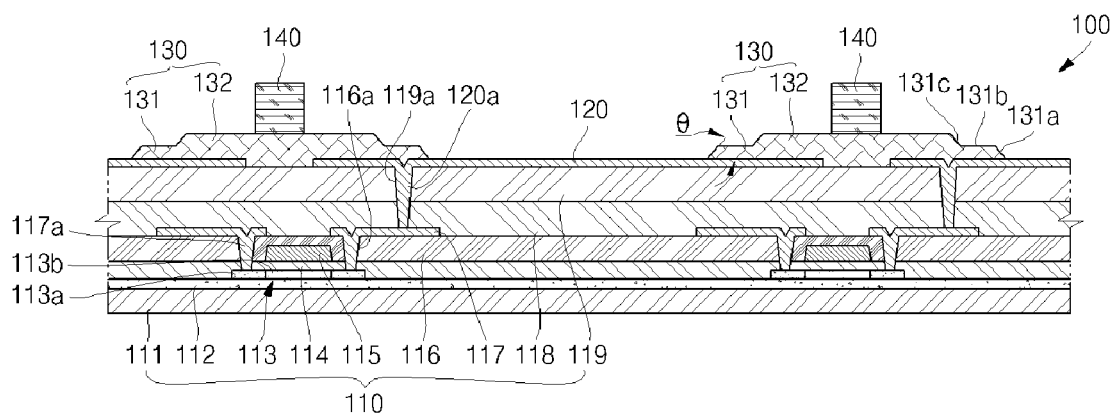
FIG. 1 is a cross-sectional view illustrating an organic light emitting display according to an embodiment of the invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

It is to be understood that where it is stated herein that one layer is "formed on" or "disposed on" a second layer, the first layer may be formed or disposed directly on the second layer or there may be at least one intervening layer between the first layer and the second layer. Further, as used herein, the term "formed on" is used with the same meaning as "located on" or "disposed on" and is not meant to be limiting regarding any particular fabrication process.

FIG. 1 is a cross-sectional view illustrating an organic light emitting display 100 according to an embodiment of the invention. The organic light emitting display 100 may include: a lower substrate 110; an anode electrode 120 formed on the lower substrate 110; a pixel definition layer 130 formed on the lower substrate 110 and the anode electrode 120 and a spacer 140 formed on the pixel definition layer 130.

The lower substrate 110 may include: a substrate material 111; a buffer layer 112 formed on the substrate material 111; an active layer 113 formed on the buffer layer 112; a gate insulating layer 114 formed on the buffer layer 112 and the active layer 113; a gate electrode 115 formed on the gate insulating layer 114; an interlayer dielectric layer 116 formed on the gate electrode 115; a source/drain electrode 117 formed on the interlayer dielectric layer 116; a protective layer 118 formed on the source/drain electrode 117 and a planarization layer 119 formed on the protective layer 118.

The substrate material 111 may be formed such that its upper surface and lower surface are parallel and approximately 0.05~1 mm thick. The substrate material 111 may be generally formed of a material such as glass, metal, a polymer or the equivalent thereof, but the material of the substrate is not limited thereto.

The buffer layer 112 may be formed on the upper surface of the substrate 111. Such buffer layer 112 prevents impurities from penetrating from the substrate material 111 into the active layer 113 or an organic light emitting diode OLED. The buffer layer 112 may be formed of a material such as silicon oxide ($SiO_2$), silicon nitride layer ($Si_3N_4$), or an equivalent inorganic material that can be easily formed during manufacture of a semiconductor, but the material is not limited thereto. The buffer layer 112 may be omitted depending on the structure of the substrate material 111 or the active layer 113 as would be appreciated by those skilled in the art. Therefore, an explanation of the omission of the buffer layer 112 is not necessary.

The active layer 113 may be formed on the upper surface of the buffer layer 112. Such active layer 113 may be formed of a material such as amorphous silicon, polycrystalline silicon, micro silicon (silicon having a grain size between amorphous silicon and polycrystalline silicon), an organic thin film or the equivalent thereof, but the material of the active layer 113 is not limited thereto.

In the case that the active layer 113 is formed of polycrystalline silicon, the active layer 113 may be formed by a laser crystallization method using a laser at low temperature, a metal induced crystallization method using a catalytic metal, or the equivalent method thereof, but the crystallization method for forming the polycrystalline silicon is not limited thereto. After an ion implantation process is performed on the active layer 113, the active layer 113 may be separately formed with source/drain regions 113a to accept source/drain electrodes 117 formed on both sides of the active layer 113, and with a channel region 113b formed between the source and drain regions.

The gate insulating layer 114 may be formed on the upper surface of the active layer 113. Such gate insulating layer 114 may also be formed on the buffer layer 112 outside of the region of the active layer 113. The gate insulating layer 114 may be formed of silicon oxide ($SiO_2$), silicon nitride ($Si_3N_4$), or an equivalent inorganic material that can be easily formed during manufacture of a semiconductor, but the material is not limited thereto.

The gate electrode 115 may be formed on the upper surface of the gate insulating layer 114. More specifically, the gate electrode 115 may be formed on the gate insulating layer 114 corresponding to a channel region in the active layer 113. Such gate electrode 115 applies an electric field to the channel region at the lower gate insulating layer 114 in order to form a hole or an electron channel in the channel region. The gate electrode 115 may be a metal or alloy (Mo, MoW, Ti, Cu, Al, AlNd, Cr, other Mo alloy, Cu alloy, other Al alloy, and the like), a doped polycrystalline silicon or the equivalent thereof, but the material is not limited thereto.

The interlayer dielectric layer 116 may be formed on the gate insulating layer 114 and the gate electrode 115. The interlayer dielectric layer 116 may be silicon oxide, silicon nitride, a polymer, glass or the equivalent thereof, but the material is not limited thereto.

An etching process that is called a contact hole process is performed so that the active layer 113 and the source/drain electrode 117 are in contact through the interlayer dielectric layer 116. The contact hole 116a is the region exposed by the above process and a conductive contact 117a is formed by injecting a metal into the contact hole 116a.

The source/drain electrode 117 may be formed on the upper surface of the interlayer dielectric layer 116 by use of PECVD (Plasma Enhanced Chemical Vapor Deposition), LPCVD (Low Pressure Chemical Vapor Deposition), sputtering, or the equivalent thereof. After the above process has been performed, the source/drain electrode 117 may be formed at a desired position by a photo resist application, exposure, development, etching, photo resist peeling, and the like. A conductive contact 117a penetrating the interlayer dielectric layer 116 may be formed between a source/drain region of the active layer 113 and the source/drain electrode 117. Of course, the conductive contact 117a may be formed through the contact hole 116a which has previously been formed.

The protective layer 118 covers the interlayer dielectric layer 116 and the source/drain electrode 117 and protects the source/drain electrode 117. Such protective layer 118 may be formed of a typical inorganic material, but the material is not limited thereto.

The planarization layer 119 may be formed on the protective layer 118. Such planarization layer 119 serves to prevent the organic light emitting diode (OLED) and a cathode electrode thereof from being shorted or disconnected because of a level difference. The planarization layer 119 may be formed from bisbenzocyclobutene (BCB), an acrylic, or the equivalent thereof, but the material is not limited thereto.

Of course, the protective layer 118 and the planarization layer 119 may be formed in advance with a via hole 119a by etching the region corresponding to the source/drain electrode 117. Later, a conductive via hole 120*a* is formed by filling the via hole 119*a* with metal. The conductive via 119*a* serves to connect the anode electrode 120 and the source/drain region of the active layer 113.

The anode electrode 120 may be formed on the planarization layer 119. The anode electrode 120 may be formed on the region to which light is transmitted in order to increase an aperture ratio. The anode electrode 120 may be formed of ITO (Indium Tin Oxide), ITO/Ag, ITO/Ag/ITO, ITO/Ag/IZO (Indium Zinc Oxide), Ag alloy (ITO/Ag alloy/ITO), or the equivalent thereof, but the material is not limited thereto. ITO is a transparent conductive film with a small hole injecting barrier in relation to the organic thin film 150 (see FIG. 2) because of a uniform work feature, and Ag reflects the light from the organic thin film 150 to the upper surface in the top emission type display (not shown).

The pixel definition layer 130 may be formed on a portion of the planarization layer 119 and a portion of the anode electrode 120. The pixel definition layer 130 may be formed on the upper planarization layer 119 to cover the end of the anode electrode 120. The pixel definition layer 130 divides pixels into red green and blue pixels (RGB, not differentiated in these Figures).

The pixel definition layer 130 may include a thick film portion 132 formed on the region including the edge of the anode electrode 120 as well as a step portion (hereinafter step portion or step down portion) 131 formed at both ends of the pixel definition layer 130. The step portion 131 has a thickness different from that of the thick film portion 132. Therefore, the organic light emitting display 100 according to an embodiment of the present invention may prevent an open edge from occurring when an emission layer is formed (see FIGS. 2 and 3), while maintaining the insulation function of the pixel definition layer 130. The pixel definition layer 130 may be formed from an acrylic-based resin, bisbenzocyclobutene (BCB), polyimide, or the equivalent thereof.

Continuing with FIG. 1, the step portion 131 may be formed to be stepped at both ends of the pixel definition layer 130. That is, the step portion 131 may be stepped down from the thick film portion 132, thereby being thinner than the thick film portion 132. The step portion 131 is the region where an emission layer is formed. The step portion 131 may include a first surface 131*a* inclined to the anode electrode 120 so that it contacts the anode electrode 120, a second surface 131*b* which is formed approximately parallel to the anode layer 120 and contacts the first surface, and a third surface 131*c* inclined to the second surface 131*b* so that it contacts the second surface 131*b*.

The first surface 131*a* is the region where an emission layer is formed. The second surface 131*b* is a step approximately parallel to the anode layer 120. The third surface 131*c* is formed to be inclined on the second surface 131*b* in order to connect the step portion 131 and the thick film portion 132.

The step portion 131 may be 0.3 um thick or less. The thickness of the step portion 131 is the distance from the anode electrode 120 to the second surface 131*b* of the step portion 131. The reason why the thickness of the step portion is 0.3 um or less is because the step portion 131 is formed with the emission layer. More specifically, the emission layer is formed on the first surface 131*a* of the step portion 131. The thicker the thickness of the step portion 131 is, the bigger the step between the upper surface of the anode electrode 120 and the step portion of the pixel definition layer is. When the step between the upper surface of the anode electrode 120 and the second surface 131*b* of the step portion 131 is bigger, an open edge may occur when forming the emission layer. Particularly, in cases where the thickness of the step portion 131 is above 0.3 um, the step between the upper surface of the anode electrode 120 and the second surface 131*b* of the thick film portion is bigger. Therefore, the emission layer may be detached in the region where the anode electrode 120 contacts the step portion 131, rather than being attached thereon. That is, an open edge may occur. Accordingly, the step portion 131 should be 0.3 um thick or less.

The thickness of the step portion 131 does not have a lower limit because the step portion 131 has to be provided in the organic light emitting display 100 according to an embodiment of the present invention. That is, the thickness of the step portion 131 should be above 0 um.

The anode electrode 120 may contact the step portion 131 at an angle of 45 degrees or less. Here, the angle between the anode electrode 120 and the step portion 131 denotes the angle θ between the anode electrode 120 and the first surface 131*a*. In cases where the angle θ between the anode electrode 120 and the first surface 131*a* is over 45 degrees, it may be difficult to attach the emission layer to the boundary surface where the first surface 131*a* contacts the anode electrode 120. That is, the open edge described above may occur. Accordingly, the angle θ between the anode electrode 120 and the first surface 131*a* is preferably 45 degrees or less.

The angle θ between the anode electrode 120 and the first surface 131*a* does not have a lower limit. The step portion 131 is provided in the organic light emitting display 100 according to an embodiment of the present invention, such that it is clear that the angle θ between the anode electrode 120 and the first surface 131*a* is over 0 degree.

The thick film portion 132 is formed on the upper planarization layer 119 and includes the edge of the anode electrode 120. The edge of the anode electrode 120 may be inside the step portion 131 of the pixel definition layer 130.

The thick film portion 132 serves as an insulator. The electric field applied to the anode electrode 120 is concentrated on the edge of the anode electrode 120. Therefore, in order to prevent a dielectric breakdown at the edge of the anode electrode 120, the thick film portion 132 should have a thickness over a predetermined value.

The thick film portion 132 may be 1 μm thick or more. The thickness of the thick film portion 132 denotes the distance from the edge of the anode electrode 120 to the upper surface of the thick film portion 132. In the case that the thickness of the thick film portion 132 is too thin, a tunneling effect may occur. That is, the possibility that an electron penetrates the thick film portion 132 increases so that a current may flow. That is, in cases where the thick film portion 132 is less than 1 μm thick, a current may penetrate the thick film portion 132 and flow because of a tunneling effect. Accordingly, the thickness of the thick film portion 132 is preferably 1 μm or more in order to maintain an insulating function.

The thickness of the thick film portion 132 does not have an upper limit, and also the thick film portion 132 may not have an infinite thickness. As long as the thick film portion 132 is 1 μm or more, the insulating function of the thick film portion 132 may not be damaged. Accordingly, it would be easy for those skilled in the art to select an appropriate thickness value in cases where the thick film portion 132 is 1 μm or more.

The thick film portion 132 may be thicker than that of the step portion 131. As described above, in order to prevent an open edge, the step portion may be 0.3 μm thick or less. Also, as discussed above, in order to maintain the insulating function, the thick film portion 132 may be 1 μm thick or more. Accordingly, the thickness of the step portion 131 may be less than that of the thick film portion 132.

Continuing with FIG. 1, a spacer 140 may be formed on the pixel definition layer 130. More specifically, the spacer 140 may protrude from the upper surface of the thick film portion 132. The spacer 140 protects the organic light emitting display 100 according to an embodiment of the present invention from external pressure. That is, the spacer 140 allows the organic light emitting display 100 according to an embodiment of the present invention to have clearance at the upper portion thereof. Therefore, the organic light emitting display 100 according to an embodiment of the present invention may not be damaged in despite of any external pressure applied thereto. The material of the spacer 140 may be a typical polyimide or the equivalent thereof, but the material is not limited thereto.

Figure 2:
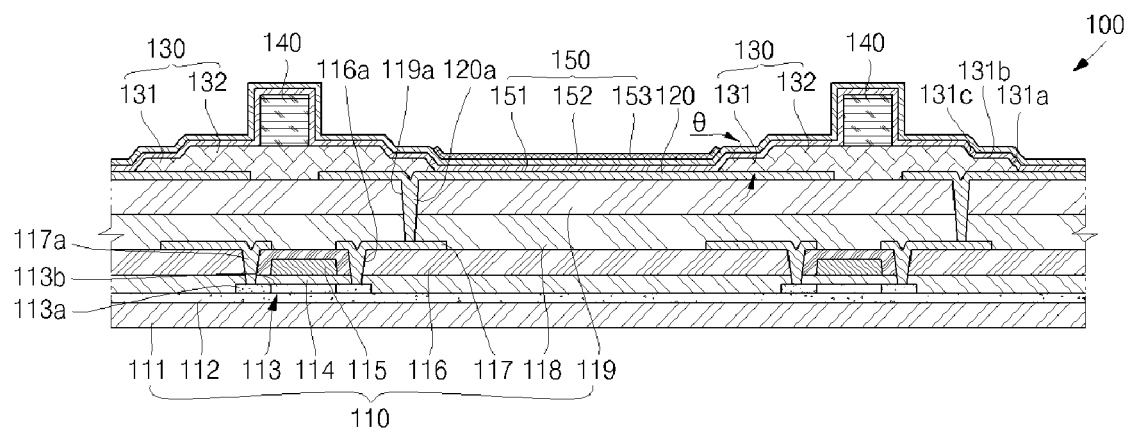
FIG. 2 is a cross-sectional view illustrating an organic light emitting display formed with an emission layer EML according to an embodiment of the invention.
Figure 3:
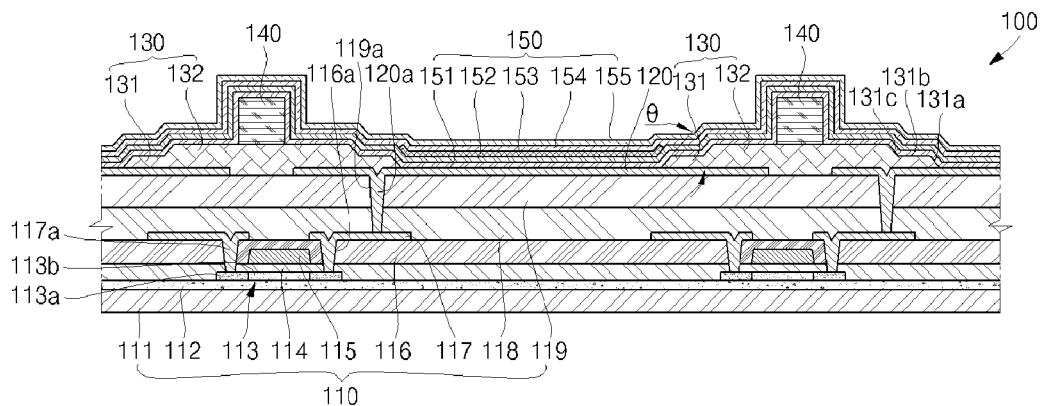
FIG. 3 is a cross-sectional view illustrating an organic light emitting display formed with an organic thin film according to an embodiment of the invention.

Hereinafter, a structure of the organic light emitting display 100 according to an embodiment of the present invention formed with an organic thin film will be described. In FIGS. 2 and 3, cross-sectional views of a structure of the organic light emitting display 100 according to an embodiment of the present invention are illustrated where the organic light emitting display is formed with an emission layer and an organic thin film thereon.

As illustrated in FIG. 2 and FIG. 3, the organic thin film 150 may be formed on the anode electrode 120, the pixel definition layer 130 and the spacer 140. The organic thin film 150 is the region where an electron and a hole contact and emit light. The organic thin film 150 may include: a hole injecting layer 151 formed on the anode electrode 120; a hole transport layer 152 formed on the hole injecting layer 151; an emission layer 153 formed on the hole transport layer 152; an electron transport layer 154 formed on the emission layer 153 and an electron injecting layer 155 formed on the electron transport layer 154.

The hole injecting layer 151 and the hole transport layer 152 may be formed at the front surface of the anode electrode 120, the pixel definition layer 130, and the spacer 140. That is, the hole injecting layer 151 and the hole transport layer 152 may be deposited on the front surface of the anode electrode 120, the pixel definition layer 130, and the spacer 140 without going through additional patterning.

The emission layer 153 is the region where a hole injected from the hole injecting layer 151 and an electron injected from the electron injecting layer 155 combine and emit light. The material of the emission layer 153 may be aluminum tris(8-hydroxyquinoline) (Alq3) as a small molecular material and phenylene vinylene as a polymer material.

As illustrated in FIG. 2, the emission layer 153 is formed on a portion of the hole transport layer 153. More specifically, the emission layer 153 is formed on the region corresponding to the anode electrode 120 and the region corresponding to the step portion 131 of the pixel definition layer 130. As described above, the thickness of the step portion 131 is thinner than that of the thick film portion 132. That is, the step portion 131 may be 0.3 um thick or less, and the angle (θ) between the anode electrode 120 and the first surface 131a may be 45 degrees or less. Therefore, the emission layer 153 may adhere closely to the boundary region where the anode electrode 120 and the first surface 131a contact. As a result, it is not possible to form the emission layer 153 without an open edge.

However, as illustrated in FIG. 3, the electron transport layer 154 and the electron injecting layer 155 may be formed in sequence on one surface of the hole transport layer 152 and the emission layer 153. Now, as described above, the organic light emitting display 100 according to an embodiment of the present invention includes the pixel definition layer 130 including the step portion 131 and the thick film portion 132 thicker than the step portion 131. The step portion 131 is formed having a uniform thickness and an inclination in relation to the anode electrode 120. Therefore, the emission layer 153 may adhere closely to the boundary region between the anode electrode 120 and the step portion of the pixel definition layer 130. As a result, an open edge may be prevented when forming the emission layer 153.

Figure 4A:
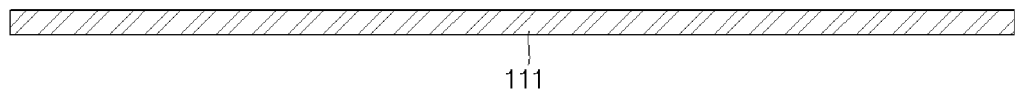
FIGS. 4A to 4P are cross-sectional views for showing the process for manufacturing an organic light emitting display according to an embodiment of the invention.

Hereinafter, a manufacturing method of an organic light emitting display 100 according to an embodiment of the present invention will be described. Referring to FIGS. 4A through 4P, a cross-sectional view is described for explaining the manufacturing sequence for an organic light emitting display 100 according to an embodiment of the present invention.

As illustrated in FIG. 4A, a substrate material 111 is first provided. The substrate material 111 may be approximately 0.05 mm to 1 mm thick. The substrate material 111 may be glass, metal, a polymer or the equivalent thereof, but the material is not limited thereto.

Figure 4B:
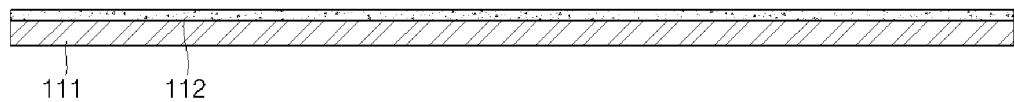

As illustrated in FIG. 4B, a buffer layer 112 is formed on the substrate 111. The buffer layer 112, as described above, may be formed of silicon oxide ($SiO_2$), silicon nitride ($Si_3N_4$), another inorganic material or the equivalent thereof, but the material is not limited thereto. The buffer layer 112 may be omitted depending on the structure of the substrate material 111 or an active layer 113.

Figure 4C:
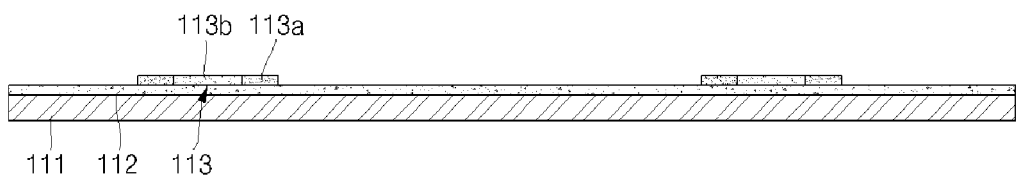

As illustrated in FIG. 4C, an active layer 113 is formed on the buffer layer 112 (or substrate material 111). The active layer 113 may be formed of amorphous silicon, polycrystalline silicon, micro silicon (silicon having a grain size between amorphous silicon and polycrystalline silicon), an organic thin film, or the equivalent thereof, but the material of the active layer 113 is not limited thereto.

When the active layer 113 is formed with polycrystalline silicon, the active layer 113 may be formed by a laser crystallization method using a laser at low temperature, a metal induced crystallization method using a catalytic metal, or an equivalent f method, but the crystallization method of the polycrystalline silicon is not limited thereto.

Although the formation process for the active layer 113 is not illustrated separately, it is doped by an ion implantation process to distinguish it from a source/drain region 113a and a channel region 113b.

Figure 4D:
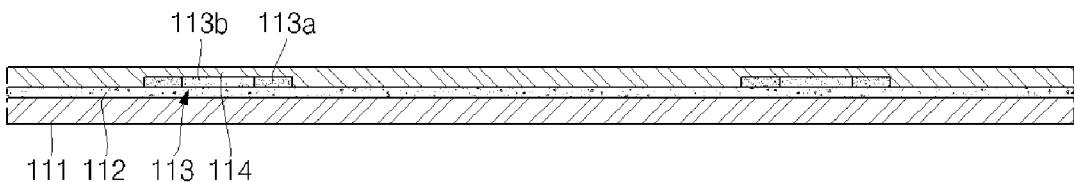

As illustrated in FIG. 4D, a gate insulating layer 114 is formed on the buffer layer 112 and the active layer 113. The gate insulating layer 114 may be formed of silicon oxide ($SiO_2$), silicon nitride ($Si_3N_4$), another inorganic layer or the equivalent thereof, but the material is not limited thereto.

Figure 4E:
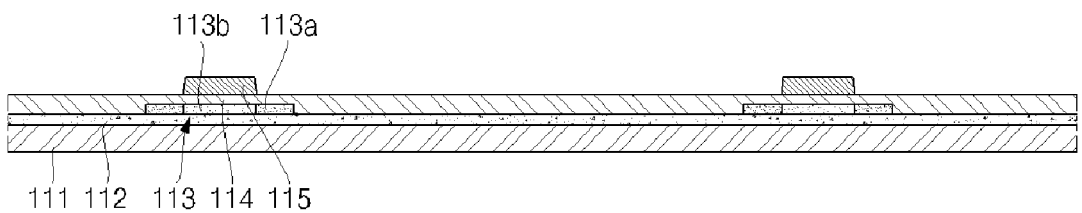

As illustrated in FIG. 4E, a gate electrode 115 is formed on the gate insulating layer 114. The gate electrode 115 may be formed of a metal or alloy (Mo, MoW, Ti, Cu, Al, AlNd, Cr, other Mo alloy, other Cu alloy, other Al alloy, and the like), a doped polycrystalline silicon or the equivalent thereof, but the material is not limited thereto. The gate electrode 115 is first formed over the gate insulating layer 114. Then, the gate electrode 115 is patterned by a photolithography process in order to have a portion corresponding to the channel region of the active layer 113.

Figure 4F:
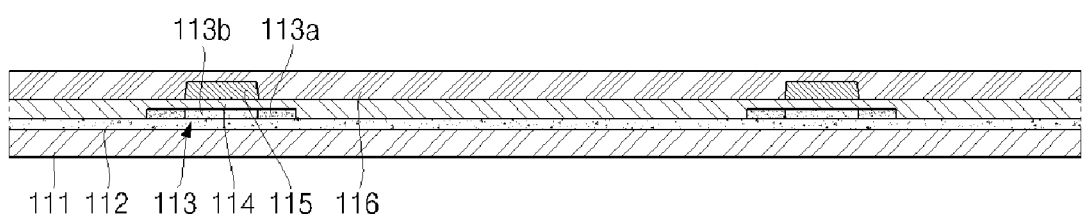

As illustrated in FIG. 4F an interlayer dielectric layer 116 is formed. The interlayer dielectric layer 116 may be formed of silicon oxide ($SiO_2$), silicon nitride ($Si_3N_4$), a polymer, glass or the equivalent thereof, but the material is not limited thereto. After the interlayer dielectric layer 116 is formed, a contact hole 116a is formed by use of a photolithography process. Then a conductive contact 117a is formed by filling up the contact hole 116a with a metal.

Figure 4G:
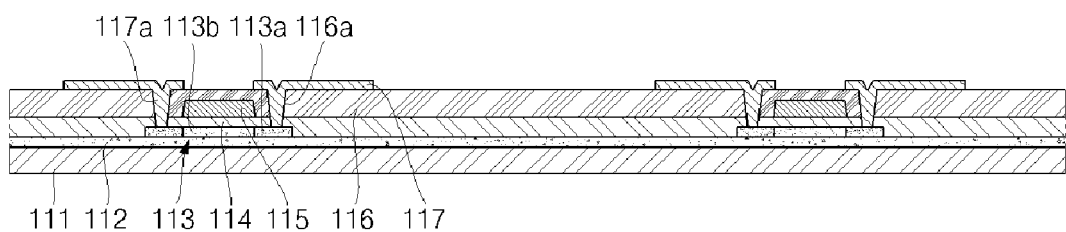

As illustrated in FIG. 4G, a source/drain electrode 117 is formed. The source/drain electrode 117 may be formed on the upper surface of the interlayer dielectric layer 116 by use of PECVD (Plasma Enhanced Chemical Vapor Deposition), LPCVD (Low Pressure Chemical Vapor Deposition), sputtering, or the equivalent thereof. Then, a pattern is formed in relation to the conductive contact 117a by use of a photolithography process.

Figure 4H:
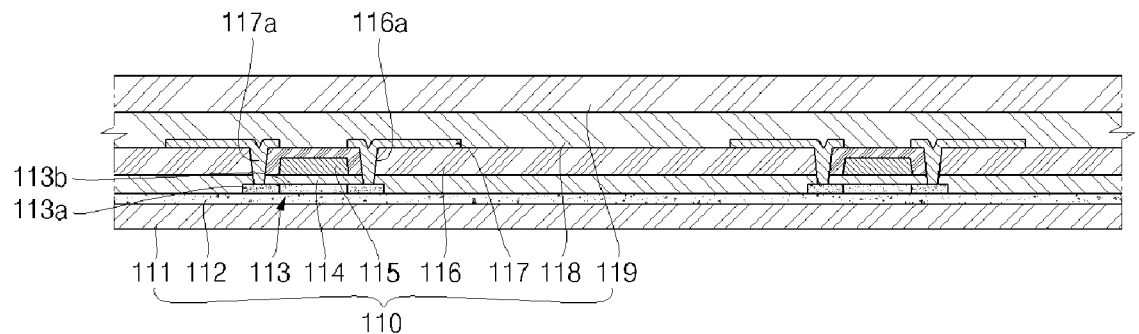
Figure 4I:
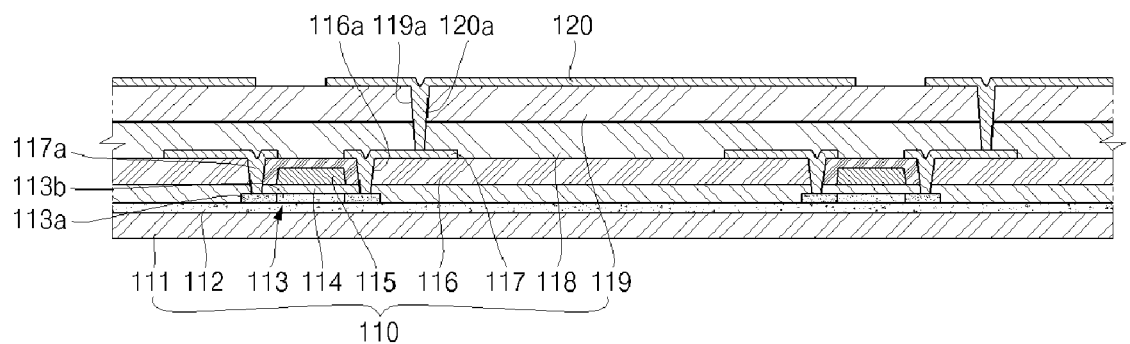

As illustrated in FIGS. 4H and 4I, a protective layer 118 and a planarization layer 119 are formed. The protective layer 118 may be formed from a typical inorganic material, but the material is not limited thereto. The planarization layer may be formed from bisbenzocyclobutene (BCB), an acrylic or the equivalent thereof, but the material is not limited thereto.

Then, a via hole 119a is formed by etching a region of the protective layer 118 and the planarization layer 119 corresponding to the source/drain electrode 117. A conductive via 120a is formed by filling up the via hole 119a with a metal.

As also illustrated in FIG. 4I, an anode electrode 120 is formed on the planarization layer 119. The anode electrode 120, as described above, may be selected from ITO (Indium Tin Oxide), ITO/Ag, ITO/Ag/ITO, ITO/Ag/IZO (Indium Zinc Oxide), Ag alloy (ITO/Ag alloy/ITO) or the equivalent thereof, but the material is not limited thereto. The anode electrode 120 is repeatedly patterned by use of a photolithography process after being deposited over the planarization layer 119.

Figure 4J:
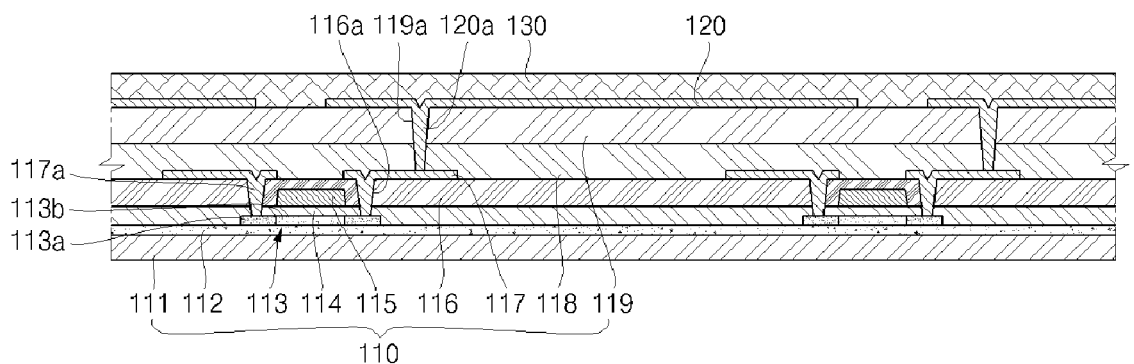

As illustrated in FIG. 4J, a pixel definition layer 130 is formed over the planarization layer 119 and the anode electrode 120. The material of the pixel definition layer 130 may be a polyimide or the equivalent thereof, but the material is not limited thereto.

Figure 4K:
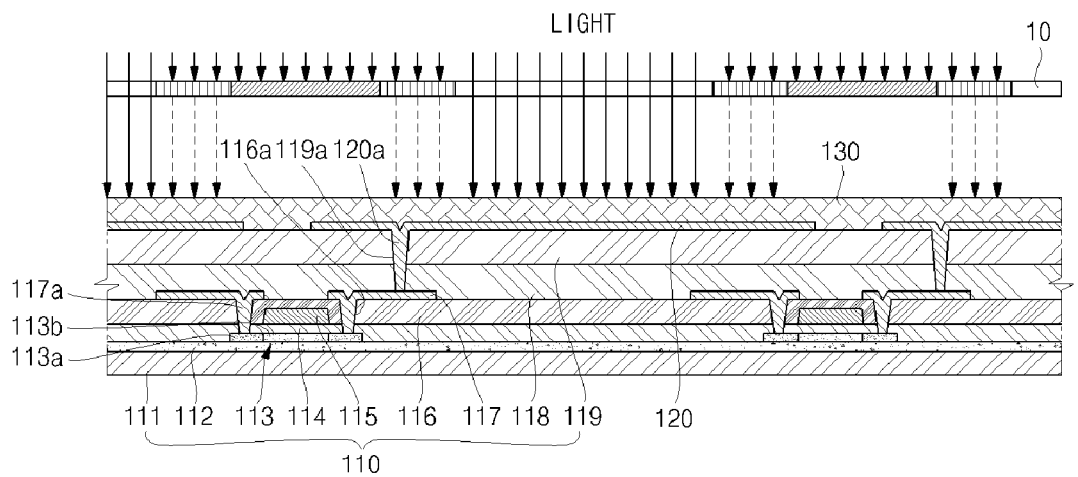
Figure 4L:
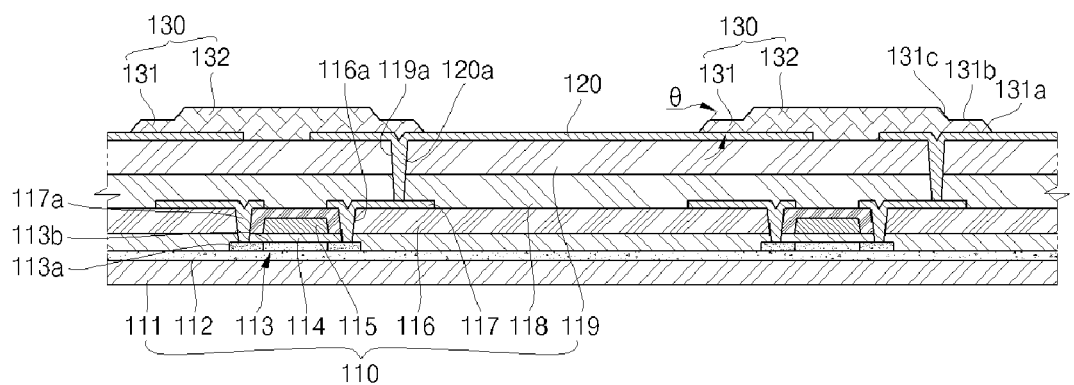

As illustrated in FIGS. 4K and 4L, a photolithography process is performed. In an organic light emitting display 100 according to an embodiment of the present invention, the pixel definition layer 130 includes a step portion 131 and a thick film portion 132. A halftone mask 10 is used to form the step portion 131 and the thick film portion 132. The halftone mask 10 may partially change the phase of the light irradiated during the photolithography process. That is, when the light permeates the halftone mask 10, the thickness of the pattern may be different, specifically in the structure having a step when the developing process is performed. As a result, the step portion 131 and the thick film portion 132 of the pixel definition layer 130 may have different thicknesses from each other by use of the halftone mask 10.

As illustrated specifically in FIG. 4L, after the photolithography process is performed, the thickness of the step portion 131 of the pixel definition layer 130 is different from that of the thick film portion 132. The step portion 131 includes the first surface 131a which has an acute angle (θ) to the anode electrode 120, the second surface 131b contacting the first surface 131a, and the third surface 131c inclined to the second surface 131b.

Figure 4M:
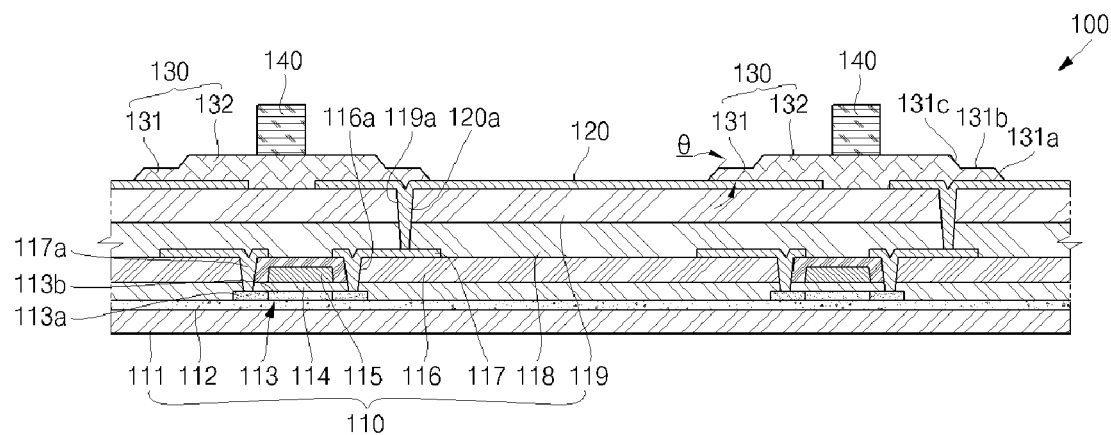

As illustrated in FIG. 4M, a spacer 140 is formed on the pixel definition layer 130. The spacer 140 may be a polyimide or the equivalent thereof, but the material is not limited thereto. The spacer 140 is patterned by use of photolithography after the spacer 140 is deposited over the anode electrode 120 and the pixel definition layer 130.

Figure 4N:
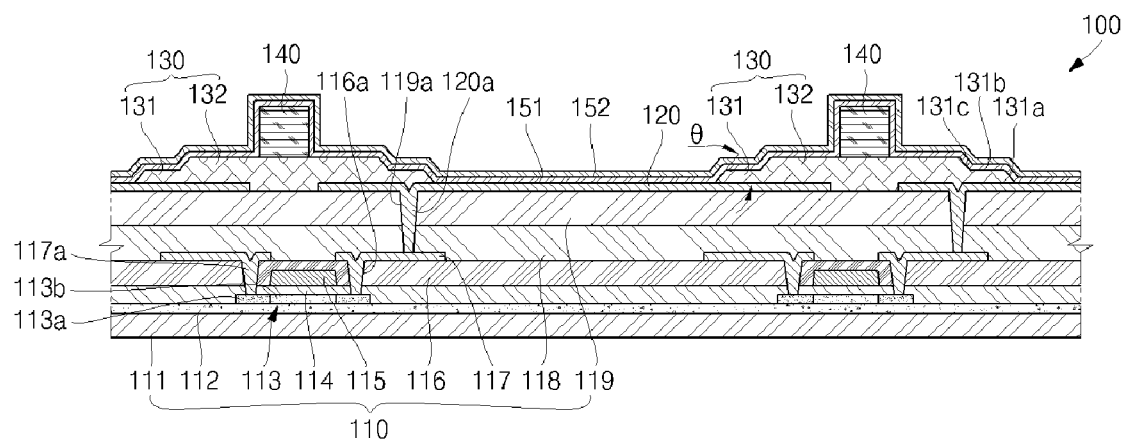

As illustrated in FIG. 4N, a hole injecting layer 151 and a hole transport layer 152 are formed in sequence. The hole injecting layer 151 and the hole transport layer 152 are formed over the anode electrode 120, the pixel definition layer 130, and the spacer 140.

Figure 4O:
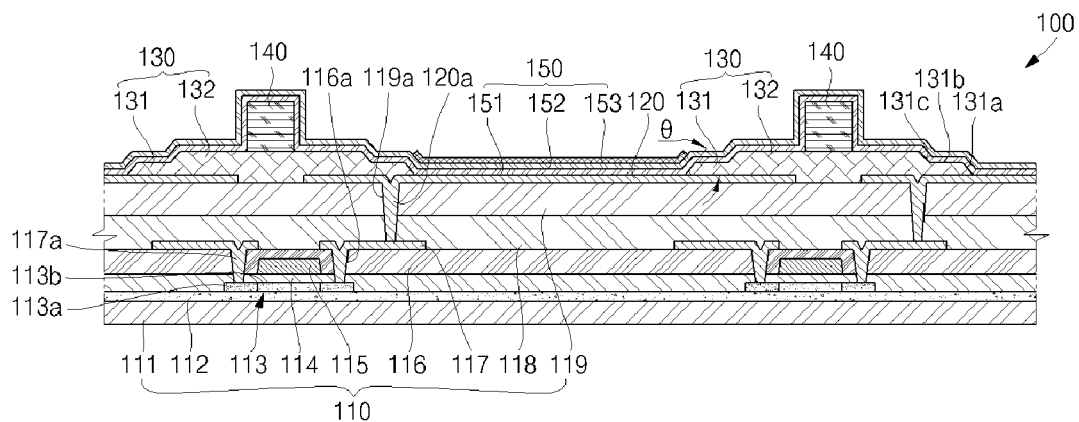
Figure 4P:
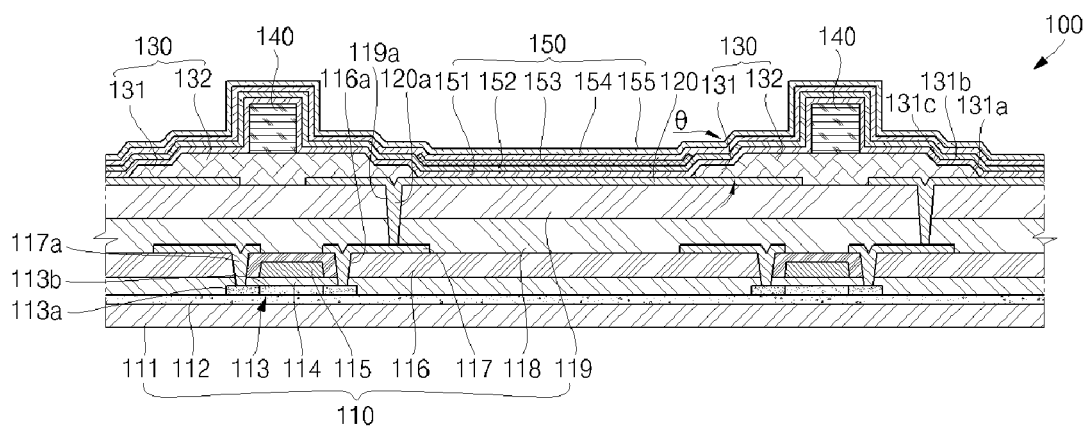

As illustrated in FIG. 4O, an emission layer 153 is formed. The material of the emission layer 153 may be aluminum tris(8-hydroxyquinoline) (Alq3) as a small molecular material and phenylene vinylene as a polymer material. The emission layer 153 may be formed by a shadow mask method, an ink-jet printing method, or laser induced thermal imaging LITI, but, the material and the manufacturing method thereof are not limited thereto. As described above, the emission layer 153 may be formed on the region where the anode electrode 120 contacts the step portion 131 of the pixel definition layer 130 that avoids having an open edge.

As illustrated in FIG. 4P, an electron transport layer 154 and an electron injecting layer 155 are formed in sequence. The electron transport layer 154 and the electron injecting layer 155 are formed over the hole transport layer 152 and the emission layer 153.

As described above, an organic light emitting display 100 according to an embodiment of the present invention is manufactured. That is, the organic light emitting display 100 according to such an embodiment of the present invention may be manufactured by a photolithography process using a halftone mask 10 as described above.

As described above, the organic light emitting display and the manufacturing method according to aspects of the present invention include the step portion which is formed to be stepped at both ends of the pixel definition layer, thereby preventing an open edge when forming the emission layer.

Finally, the organic light emitting display and the manufacturing method according to aspects of the present invention as described above provide that the thick film portion of the pixel definition layer has a predetermined thickness to prevent a dielectric breakdown occurring at an edge of the anode electrode and to improve the diode's reliability.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. An organic light emitting display comprising:
   a substrate;
   an active layer on the substrate;
   a planarization layer on the active layer;
   an anode electrode on the planarization layer;
   a pixel definition layer on an upper surface of the planarization layer covering an edge of the anode electrode;
   a spacer on the pixel definition layer; and
   an organic thin film completely covering the pixel definition layer and the spacer,
   wherein the pixel definition layer includes a thick film portion and a step down portion which is stepped down at both ends of the thick film portion, and the edge of the anode electrode is positioned under a region of the thick film portion.

2. The organic light emitting display as claimed in claim 1, wherein the step down portion is 0.3 μm thick or less.

3. The organic light emitting display as claimed in claim 1, wherein the thick film portion is 1 μm thick or more.

4. The organic light emitting display as claimed in claim 1, wherein the organic thin film comprises an emission layer and the emission layer covers the anode electrode, a portion of the step down portion, and the spacer.

5. The organic light emitting display as claimed in claim 4, wherein the step down portion comprises a first surface contacting the anode electrode, a second surface contacting the first surface, and a third surface inclined to the second surface so that the third surface contacts the second surface, and the emission layer covers the first surface.

6. The organic light emitting display as claimed in claim 5, wherein an angle between the anode electrode and the first surface is 45 degrees or less.

7. A manufacturing method of an organic light emitting display comprising:
   forming an active layer on a substrate;
   forming a planarization layer on the active layer;
   forming an anode electrode on the planarization layer;
   forming a pixel definition layer on an upper surface of the planarization layer to cover an edge of the anode electrode;
   forming a spacer on the pixel definition layer; and
   forming an organic thin film completely covering the pixel definition layer and the spacer,
   wherein the pixel definition layer includes a thick film portion and a step down portion at both ends of the thick film portion, and the edge of the anode electrode is positioned under a region of the thick film portion.

8. The manufacturing method as claimed in claim 7, wherein the step down portion of the pixel definition layer is 0.3 μm thick or less.

9. The manufacturing method as claimed in claim 7, wherein the thick film portion is 1 μm thick or more.

10. The manufacturing method as claimed in claim 7, wherein the organic thin film includes an emission layer, and the emission layer covers the anode electrode, the step down portion of the pixel definition layer, and the spacer.

11. The manufacturing method as claimed in claim 10, wherein the organic thin film covers the step down portion and the thick film portion of the pixel definition layer to include a first surface contacting the anode electrode, a second surface contacting the first surface, and a third surface inclined to the second surface so that the third surface contacts the second surface, and the emission layer is formed on the first surface.

12. The manufacturing method as claimed in claim 11, wherein the organic thin film contacts the anode electrode at an angle of 45 degrees or less.

13. The manufacturing method as claimed in claim 7, wherein the pixel definition layer is formed by a photolithography process.

14. The manufacturing method as claimed in claim 7, wherein the pixel definition layer is formed by a halftone mask that partially changes the phase of radiated light.

15. The organic light emitting display of claim 1, wherein the spacer protrudes from an upper surface of the thick film portion.

16. The manufacturing method of an organic light emitting display of claim 7, wherein the spacer protrudes from an upper surface of the thick film portion.

* * * * *